United States Patent [19]

Uehira

[11] Patent Number: 4,857,375
[45] Date of Patent: Aug. 15, 1989

[54] SHIELDING OF SEMICONDUCTOR MODULE

[75] Inventor: Shigeyuki Uehira, Nara, Japan

[73] Assignee: Sharp Kabushiki Kaisha, Osaka, Japan

[21] Appl. No.: 169,826

[22] Filed: Mar. 17, 1988

[30] Foreign Application Priority Data

Mar. 31, 1987 [JP] Japan .............................. 62-48145[U]

[51] Int. Cl.$^4$ ............................................. B32B 3/00
[52] U.S. Cl. ..................................... 428/75; 428/136; 428/137; 428/155; 428/209; 428/901; 428/198; 174/36
[58] Field of Search ............... 428/136, 137, 155, 209, 428/901, 68, 75, 76, 198; 174/36

[56] References Cited

U.S. PATENT DOCUMENTS

| | | | |
|---|---|---|---|
| 2,963,535 | 12/1960 | Wegener et al. | 174/36 |
| 3,613,230 | 10/1971 | Griff | 174/36 |
| 3,624,267 | 11/1971 | Plummer | 174/36 |
| 3,968,287 | 7/1976 | Balk | 428/136 |

Primary Examiner—Ellis P. Robinson
Assistant Examiner—P. J. Ryan
Attorney, Agent, or Firm—Flehr, Hohbach, Test, Albritton & Herbert

[57] ABSTRACT

A copper foil sheet is pasted onto the surface of a semiconductor module case to shield it from static electricity and noise. The sheet is provided with cross-cut lines corresponding to the positions of protruding parts on the surface of the case such that the sheet can be pasted along the contours of these protruding parts to improve its shielding effects.

6 Claims, 1 Drawing Sheet

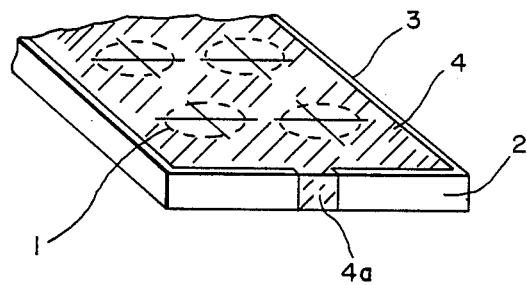
FIG.—1
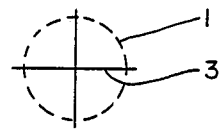
FIG.—2A
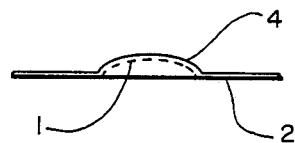
FIG.—2B
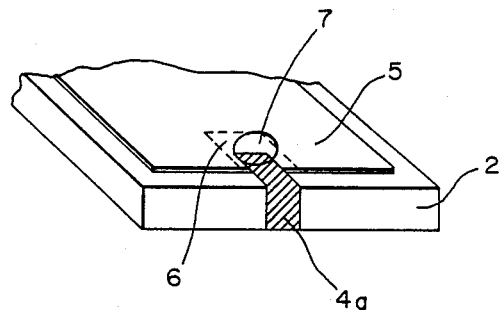
FIG.—3

SHIELDING OF SEMICONDUCTOR MODULE

BACKGROUND OF THE INVENTION

This invention relates to the shielding of a module using semiconductor devices such as LSI circuits against static electricity and noise.

In order to shield a semiconductor module including a timer control panel such as an electronic range against static electricity and noise (high-frequency noise, in particular), it has been considered to paste a sheet of copper foil on the outer surface of the semiconductor module case and to connect it through a lead line or the like to a source grounding line. If the surface of the module case has protruding parts such as keys, however, the copper foil sheet becomes flexed at the positions of these protrusions and it is therefore difficult to paste such a sheet tightly and uniformly all over the case surface. If the protruding parts can be shielded only imperfectly, some important functions such as key strokes may be adversely affected.

SUMMARY OF THE INVENTION

It is therefore an object of the present invention to provide a simple shielding structure and method for a semiconductor module having protruding parts against static electricity and noise. According to the present invention, not only is a copper foil sheet pasted on the surface of a case of a semiconductor module having protruding parts thereon, but cross-cut lines are also provided to this copper foil sheet corresponding to the positions of such protruding parts. With such cross-cut lines provided, the copper foil sheet according to the present invention can be pasted along the contours of the protruding parts. As a result, the module surface can be shielded sufficiently completely, inclusive of its protruding parts such as its keys.

Brief Description of the Drawings

The accompanying drawings, which are incorporated in and form a part of the specification, illustrate an embodiment of the present invention and, together with the description, serve to explain the principles of the invention. In the drawings:

FIG. 1 is a diagonal view of a portion of the top surface of a module embodying the present invention, FIGS. 2A and 2B are plan and sectional views of a protruding part shown in FIG. 1, and FIG. 3 is a diagonal view of a portion of the bottom surface of the module of FIG. 1.

Detailed Description of the Invention

With reference to FIG. 1 which shows a semiconductor module embodying the present invention having protruding parts 1 such as keys on the top surface of its module case 2 and this top surface is covered with a copper foil sheet 4 serving as its shield which is thereonto and has cross-cut lines 3 at positions corresponding to these protruding parts 1. These cross-cut lines 3 are preliminarily formed on the copper foil sheet 4 and when the sheet 4 is pasted onto the top surface of the case 2, it is positioned such that these cross-cut lines 3 match the protruding parts 1 formed on the module case 2. An adhesive or the like is used for pasting the sheet 4 onto the case 2.

With the shielding structure as described above, the flections in the copper foil sheet 4 can be absorbed by the cross-cut lines such that, as shown in FIGS. 2A and 2B, the copper foil shielding sheet 4 can be pasted in the shape of the protruding parts 1 on the module case 2 according to the contour thereof. Thus, the function of the shield is not adversely affected by the protrusions and such protruding parts themselves can be sufficiently well shielded.

According to the embodiment described above, one end of the copper foil shielding sheet 4 is protrudingly extended to form an extension 4a. This extension 4a is bent as shown in FIG. 3 along the outer edges of the module case 2 to the back surface thereof and is temporarily affixed to a grounding pattern land 6 of a printed wiring board 5. Since an adhesive is present on the back surface of the copper foil sheet 4, this extended part 4a can be easily pasted onto the outer surface of the module case 2 and the back surface of the printed wiring board 5 to be temporarily affixed thereto. If the extended part 4a of the copper foil sheet 4 is plated onto the grounding pattern land 6, the copper foil sheet 4 becomes grounded and such a connection is more advantageous from the point of view of strength than by using a separate lead line. In FIG. 3, numeral 7 indicates solder. With a part of the copper foil sheet 4 thus connected to the grounding line of the printed wiring board 5 for the module, the antistatic property as well as resistance against external noise, and in particular against high-frequency noise can be significantly improved.

The foregoing description of a preferred embodiment of the invention has been presented for purposes of illustration and description. It is not intended to be exhaustive or to limit the invention to the precise form disclosed and many modifications and variations are possible in light of the above teaching. The present invention is particularly effective when applied to the control panel of a timer for an electronic range.

What is claimed is:

1. In a shielding structure for a case of a semiconductor module having on an external surface thereof protruding parts with a dome-shaped contour, the improvement wherein said shielding structure comprises a copper foil shielding sheet provided with cross-cut lines corresponding to the positions of said protruding parts said shielding sheet having a contacting surface thereof coated with an adhesive and being pasted on said external surface of said semiconductor module inclusive of said protruding parts along said dome-shaped contour with said contacting surface contacting said external surface of said semiconductor module case and said protruding parts.

2. The shielding structure of claim 1 wherein said copper foil sheet has a protrudingly extended part pasted onto a peripheral surface of said case and connected to a back surface of a printing wiring board of said module.

3. The shielding structure of claim 1 wherein said extended part is soldered to a grounding line.

4. A method of shielding a semiconductor module case having an external surface provided with protruding parts with a dome-shaped contour, said method comprising the steps of providing a copper foil shielding sheet having a contacting surface thereof coated with an adhesive and crosscut lines formed corresponding to the positions of said protruding parts, and pasting said shielding sheet onto said external surface of said case inclusive of said protruding parts along said dome-shaped contour with said contacting surface contacting said external surface and said protruding parts such that said cross-cut lines match said protruding parts.

5. The method of claim 4 wherein said copper foil shielding sheet has a protrudingly extended part, said semiconductor module case contains a printed wiring board, and said method further comprises the step of connecting said extended part of said sheet with a back surface of said printed wiring board.

6. The method of claim 6 further comprising the step of connecting said extended part with a grounding line.

* * * * *